(12) United States Patent
Zhang et al.

(10) Patent No.: US 10,497,791 B2
(45) Date of Patent: Dec. 3, 2019

(54) SEMICONDUCTOR DEVICE HAVING A SURFACE INSULATING LAYTER AND MANUFACTURING METHOD THEREFOR

(71) Applicants: Semiconductor Manufacturing International (Shanghai) Corporation, Shanghai (CN); Semiconductor Manufacturing International (Beijing) Corporation, Beijing (CN)

(72) Inventors: Xianming Zhang, Shanghai (CN); Ling Tang, Shanghai (CN); Leibin Yuan, Shanghai (CN); Feng Dou, Shanghai (CN); Feng Chen, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 16/392,107

(22) Filed: Apr. 23, 2019

(65) Prior Publication Data
US 2019/0252194 A1 Aug. 15, 2019

Related U.S. Application Data

(62) Division of application No. 15/820,561, filed on Nov. 22, 2017, now Pat. No. 10,312,093.

(30) Foreign Application Priority Data

Mar. 24, 2017 (CN) .......................... 2017 1 0180158

(51) Int. Cl.
*H01L 29/423* (2006.01)
*H01L 21/28* (2006.01)
(Continued)

(52) U.S. Cl.
CPC .... *H01L 29/4236* (2013.01); *H01L 21/28247* (2013.01); *H01L 21/28568* (2013.01);
(Continued)

(58) Field of Classification Search
CPC ........... H01L 29/66348; H01L 29/7428; H01L 29/4236; H01L 29/42364
See application file for complete search history.

(56) References Cited

U.S. PATENT DOCUMENTS 7,879,676 B2 2/2011 Lee
2010/0193835 A1* 8/2010 Hshieh .............. H01L 29/41708
257/139
(Continued)

*Primary Examiner* — Scott B Geyer
(74) *Attorney, Agent, or Firm* — Brinks Gilson & Lione

(57) ABSTRACT

The present disclosure relates to the technical field of semiconductors, and discloses a semiconductor device and a manufacturing method therefor. The manufacturing method includes: providing a semiconductor structure, where the semiconductor structure includes an active region and a gate structure located in the active region, the gate structure at least including a gate electrode, and the active region exposing an upper surface of the gate electrode; forming a surface insulator layer on the upper surface of the gate electrode; forming a patterned interlayer dielectric layer on the semiconductor structure, where the interlayer dielectric layer covers the surface insulator layer, and has a first through hole exposing a portion of the active region; and forming a conductive contact layer passing through the first through hole and contacting with the active region. The present disclosure may reduce a leakage current which is possibly generated between the conductive contact layer and the gate electrode, so as to improve the performance of the device.

9 Claims, 7 Drawing Sheets

(51) Int. Cl.
*H01L 21/311* (2006.01)
*H01L 29/417* (2006.01)
*H01L 21/285* (2006.01)
*H01L 29/49* (2006.01)
*H01L 21/768* (2006.01)
*H01L 21/321* (2006.01)
*H01L 23/00* (2006.01)

(52) U.S. Cl.
CPC .. *H01L 21/31144* (2013.01); *H01L 21/32105* (2013.01); *H01L 21/76834* (2013.01); *H01L 24/05* (2013.01); *H01L 29/41741* (2013.01); *H01L 29/41775* (2013.01); *H01L 29/4916* (2013.01); *H01L 2224/04042* (2013.01); *H01L 2224/05017* (2013.01); *H01L 2224/05019* (2013.01); *H01L 2224/05124* (2013.01)

(56) References Cited

U.S. PATENT DOCUMENTS

| | | | |
|---|---|---|---|
| 2011/0233606 A1* | 9/2011 | Hsieh | H01L 29/0626 257/139 |
| 2012/0270375 A1 | 10/2012 | Sasagawa | |
| 2015/0270278 A1 | 9/2015 | Hayakawa | |
| 2015/0270361 A1 | 9/2015 | Yoshimoto | |
| 2016/0093712 A1 | 3/2016 | Tsai | |
| 2016/0149016 A1 | 5/2016 | Farmer | |
| 2016/0247741 A1 | 8/2016 | Liao | |
| 2017/0141205 A1 | 5/2017 | Yeh | |

* cited by examiner

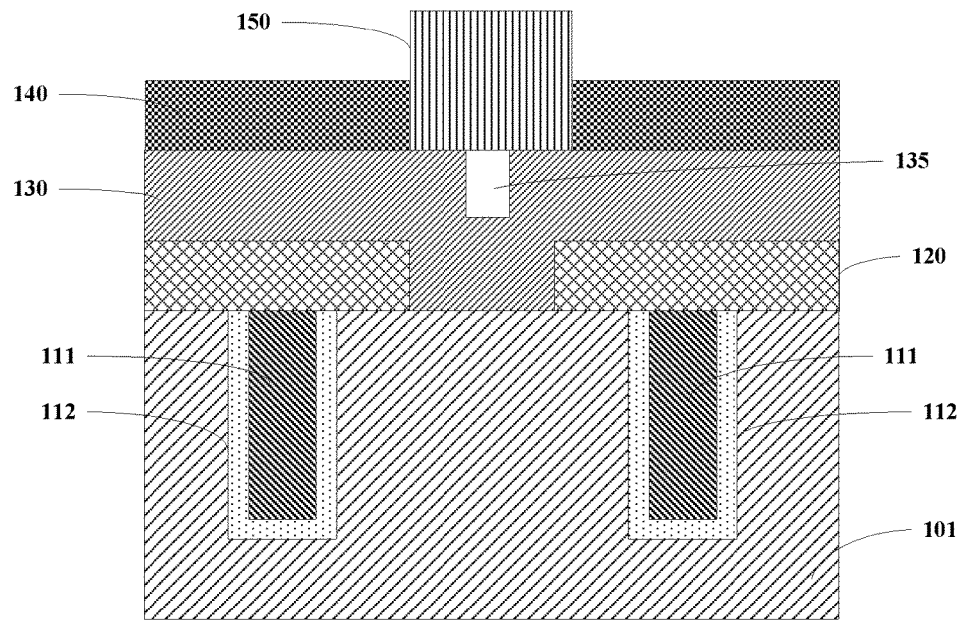

FIG. 1

| Provide a semiconductor structure. The semiconductor structure includes: an active region and a gate structure located in the active region, the gate structure at least including a gate electrode, and the active region exposing an upper surface of the gate electrode | S201 |
|---|---|
| Form a surface insulator layer on the upper surface of the gate electrode | S202 |
| Form a patterned interlayer dielectric layer on the semiconductor structure, where the interlayer dielectric layer covers the surface insulator layer, and has a first through hole exposing a portion of the active region | S203 |
| Form a conductive contact layer passing through the first through hole and contacting with the active region | S204 |

FIG. 2

SEMICONDUCTOR DEVICE HAVING A SURFACE INSULATING LAYTER AND MANUFACTURING METHOD THEREFOR

CROSS-REFERENCE TO RELATED APPLICATION

This application is a divisional of U.S. application Ser. No. 15/820,561 (still pending), filed on Nov. 22, 2017 which claims priority to Chinese Patent Application CN 201710180158.5, filed Mar. 24, 2017, the entire contents of each of which is incorporated herein by reference.

BACKGROUND

Technical Field

The present disclosure relates to the technical field of semiconductors, and in particular, to a semiconductor device and a manufacturing method therefor.

Related Art

Currently, in the course of manufacturing a semiconductor device (such as an IGBT (insulated gate bipolar transistor)), manufacturing a connection line of an active region is usually involved. As shown in FIG. 1, a gate insulator layer 112 and a gate electrode 111 exist in an active region 101. An interlayer dielectric (ILD) layer 120 is formed on the active region 101, where the interlayer dielectric layer 120 is formed with a through hole (the through hole may be referred to as a contact through hole) which exposes the active region. Subsequently, an aluminum contact layer 130 passing through the through hole and contacting with the active region 101 is formed. A passivation layer 140 is formed on the aluminum contact layer 130, and a metal wire 150 is bonded on the aluminum contact layer 130. Usually, the aluminum contact layer 130 may be formed using the PVD (physical vapor deposition) process.

SUMMARY

The inventor of the present disclosure finds that, in the course that a device is operating or that the device ends the operation, sometimes a gate voltage oscillation may be generated, so that leakage current may be generated between an aluminum contact layer and a gate electrode. This may degrade performance of the device.

In addition, the inventor of the present disclosure further finds that there is a large contact angle when using the PVD process to form step coverage at a through hole and to form the aluminum contact layer. As a result, a slot or a hole may be generated in the aluminum contact layer. The slot or the hole may affect the metal wire bonding process, so as to reduce reliability of the device.

According to a first aspect of the present disclosure, a method for manufacturing a semiconductor device is provided, including: providing a semiconductor structure, where the semiconductor structure includes: an active region and a gate structure located in the active region, the gate structure at least including a gate electrode, and the active region exposing an upper surface of the gate electrode; forming a surface insulator layer on the upper surface of the gate electrode; forming a patterned interlayer dielectric layer on the semiconductor structure, where the interlayer dielectric layer covers the surface insulator layer, and has a first through hole exposing a portion of the active region; and forming a conductive contact layer passing through the first through hole and contacting with the active region.

In some forms, the surface insulator layer is formed through performing oxidation on the upper surface of the gate electrode.

In some forms, material of the gate electrode includes a polysilicon; and material of the surface insulator layer includes an oxide of silicon.

In some forms, the upper surface of the gate electrode is oxidized through performing annealing processing on the upper surface of the gate electrode in an atmosphere of air or oxygen, so as to form the surface insulator layer.

In some forms, the annealing processing is a laser annealing processing.

In some forms, steps of performing the laser annealing processing include: forming a patterned first mask layer on the semiconductor structure, the first mask layer having a first opening exposing the upper surface of the gate electrode; in an atmosphere of air or oxygen, irradiating a laser pulse to the upper surface of the gate electrode through the first opening, so as to perform the laser annealing processing, thereby oxidizing the upper surface of the gate electrode; and removing the first mask layer.

In some forms, a wavelength range of the laser pulse is from 200 nm to 350 nm.

In some forms, a thickness of the surface insulator layer is controlled and adjusted by adjusting energy and/or irradiation times of the laser pulse.

In some forms, the first through hole is a tapered through hole, the tapered through hole having an upper opening far away from an upper surface of the active region and a lower opening adjacent to the upper surface of the active region, where a width of the upper opening is greater than a width of the lower opening.

In some forms, an angle range of a side-wall inclination angle of the tapered through hole is from 30° to 40°.

In some forms, the step of the forming a patterned interlayer dielectric layer on the semiconductor structure includes: forming an interlayer dielectric layer covering the semiconductor structure; forming a patterned second mask layer on the interlayer dielectric layer, where the second mask layer has a second opening exposing a portion of the interlayer dielectric layer; performing reflow processing on the second mask layer, so as to reduce a side-wall inclination angle of the second opening; etching the interlayer dielectric layer using the second mask layer processed with the reflow processing as a mask, so as to form the first through hole; and removing the second mask layer.

In some forms, a temperature range of the reflow processing is from 100° C. to 300° C.; and a time range of the reflow processing is from 2 minutes to 5 minutes.

In some forms, in the step of the providing a semiconductor structure, the gate structure further includes a gate insulator layer separating the gate electrode from the active region; and in the step of forming the surface insulator layer, the surface insulator layer and the gate insulator layer enclose the gate electrode.

In some forms, the method further includes: forming a patterned passivation layer on the conductive contact layer, the passivation layer having a second through hole exposing a portion of the conductive contact layer; and forming a metal connector passing through the second through hole and contacting with the conductive contact layer.

The foregoing manufacturing method may form a surface insulator layer on an upper surface of a gate electrode, so as to increase a distance from the gate electrode to the conductive contact layer. In this way, a leakage current that is possibly generated between the conductive contact layer and the gate electrode may be reduced, so that performance of a device is improved.

Further, in the foregoing manufacturing method, a through hole of an interlayer dielectric layer (i.e., the first through hole) may further present a taper shape with a smaller side-wall inclination angle in comparison with the prior art. Therefore, a step coverage of the conductive contact layer may be improved, and a slot or a hole that may be formed in the conductive contact layer is reduced, thereby facilitating subsequent bonding of a metal connector (or a metal wire), and improving reliability of the device.

According to a second aspect of the present disclosure, a semiconductor device is provided, including: an active region; a gate structure located in the active region, the gate structure at least including a gate electrode, and the active region exposing an upper surface of the gate electrode; a surface insulator layer on the upper surface of the gate electrode; a patterned interlayer dielectric layer on the active region, where the interlayer dielectric layer covers the surface insulator layer, and has a first through hole exposing a portion of the active region; and a conductive contact layer passing through the first through hole and contacting with the active region.

In some forms, material of the gate electrode includes a polysilicon; and material of the surface insulator layer includes an oxide of silicon.

In some forms, the first through hole is a tapered through hole, the tapered through hole having an upper opening far away from an upper surface of the active region and a lower opening adjacent to the upper surface of the active region, where a width of the upper opening is greater than a width of the lower opening.

In some forms, an angle range of a side-wall inclination angle of the tapered through hole is from 30° to 40°.

In some forms, the gate structure further includes a gate insulator layer separating the gate electrode from the active region, where the surface insulator layer and the gate insulator layer enclose the gate electrode.

In some forms, the semiconductor device further includes: a patterned passivation layer on the conductive contact layer, the passivation layer having a second through hole exposing a portion of the conductive contact layer; and a metal connector passing through the second through hole and contacting with the conductive contact layer.

In the foregoing semiconductor device, the surface insulator layer is formed on the upper surface of the gate electrode, so as to increase a distance from the gate electrode to the conductive contact layer. In this way, a leakage current that is possibly generated between the conductive contact layer and the gate electrode may be reduced, so that performance of the device is improved.

Further, in the foregoing semiconductor device, a through hole of the interlayer dielectric layer (i.e., the first through hole) presents a taper shape with a smaller side-wall inclination angle in comparison with the prior art. Therefore, a step coverage of the conductive contact layer may be improved, and a slot or a hole that may be formed in the conductive contact layer is reduced, thereby facilitating bonding of a metal connector, and improving reliability of the device.

Exemplary forms of the present disclosure are described in detail below with reference to the accompanying drawings, so that other features and advantages of the present disclosure become apparent.

BRIEF DESCRIPTION OF THE DRAWINGS

The accompanying drawings which constitute a part of the specification illustrate forms of the present disclosure and, together with the description, serve to interpret the principles of the present disclosure.

With reference to the accompanying drawings, the present disclosure may be appreciated more clearly according to the following detailed description, where:

FIG. 1 is a sectional diagram that schematically illustrates a structure of bonding of a metal wire of a semiconductor device in the prior art;

FIG. 2 is a flowchart of a method for manufacturing a semiconductor device according to some forms of the present disclosure;

DETAILED DESCRIPTION

Figure 3:
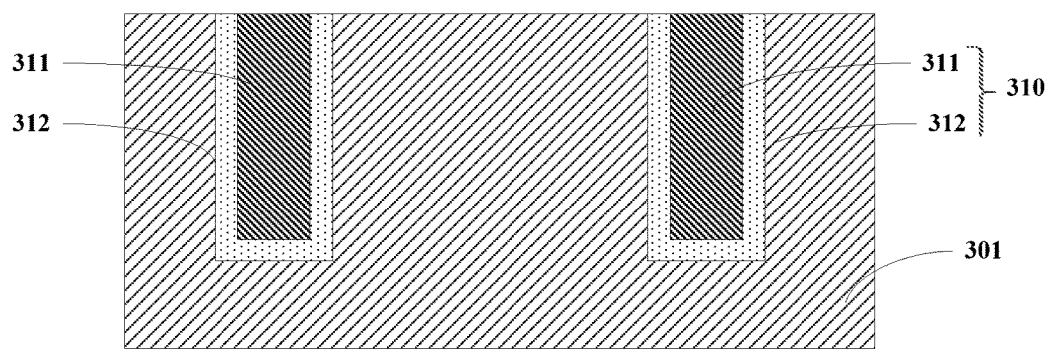
FIG. 3 is a sectional diagram that schematically illustrates a structure at a phase of a manufacturing process of a semiconductor device according to some forms of the present disclosure.

For illustration purposes, implementations of the present disclosure are described in detail with reference to the accompanying drawings. It should be noted that, unless otherwise specified, relative layouts, mathematical expressions, and numeric values of components and steps described in these forms do not limit the scope of the present disclosure.

Meanwhile, it should be appreciated that for easy of description, sizes of the parts shown in the accompanying drawings are not drawn according to an actual proportional relation.

The following description of at least one exemplary form is for illustrative purposes only, and should by no means be used as any limitation on the present disclosure and applications or uses thereof.

Technologies, methods, and devices that are known by a person of ordinary skill in the related fields may not be discussed in detail. However, in proper cases, the technologies, methods, and devices should be considered as a part of the authorized description.

In all examples shown and discussed herein, any specific value should be interpreted as illustrative only rather than as a limitation. Therefore, other examples of the exemplary forms may have different values.

It should be noted that similar reference numerals and letters represent similar items in the following accompanying drawings. Therefore, once an item is defined in a figure, the item does not need to be further discussed in the subsequent figures.

The inventor of the present disclosure finds that, in the course that a device is operating or that the device ends the operation, sometimes a gate voltage oscillation may be generated (for example, when the device is turned off, a voltage change rate is great, and an overshoot voltage is also great), so that leakage current may be generated between an aluminum contact layer and a gate electrode. This may degrade performance of the device.

In addition, the inventor of the present disclosure also finds that there is a large contact angle (the contact angle refers to an included angle between a side wall of a contact through hole of an interlayer dielectric layer 120 and an upper surface of an active region 101, and the contact angle may be a right angle or a large acute angle (for example, an acute angle from 50° to 60°)) when forming step coverage at a through hole and forming the aluminum contact layer using the PVD process. As a result, a slot or a hole 135 may be generated in the aluminum contact layer (as shown in FIG. 1). Sometimes, particles of a passivation layer may fall in the slot or hole. The slot or hole may affect the metal wire bonding process. For example, false welding or unsoldering may occur, thereby finally reducing the reliability of the device.

Better step coverage may be obtained by using the hot metal process, or the foregoing slot or hole may be reduced by optimizing the appearance of the contact through hole through various homotropic etching. However, both the process and the method need to purchase new equipment, resulting in higher manufacturing cost.

FIG. 2 is a flowchart of a method for manufacturing a semiconductor device according to some forms of the present disclosure. FIG. 3 to FIG. 13 are sectional diagrams that schematically illustrate structures at multiple phases of a manufacturing process of a semiconductor device according to some forms of the present disclosure. A manufacturing process of a semiconductor device according to some forms of the present disclosure is described below in detail with reference to FIG. 2 to FIG. 13.

First, as shown in FIG. 2, in step S201, a semiconductor structure is provided. The semiconductor structure includes: an active region and a gate structure located in the active region. The gate structure at least includes a gate electrode, and the active region exposes an upper surface of the gate electrode.

FIG. 3 is a sectional diagram that schematically illustrates a structure at step S201 according to some forms of the present disclosure. As shown in FIG. 3, the semiconductor structure is provided. The semiconductor structure may include: an active region 301 and a gate structure 310 located in the active region 301. The gate structure 310 at least includes a gate electrode 311. The active region 301 exposes an upper surface of the gate electrode 311. In the step S201, the gate structure 310 may further include a gate insulator layer 312 separating the gate electrode 311 from the active region 301.

In some forms, the material of the active region 301 may include a silicon, material of the gate electrode 311 may include a polysilicon (such as doped polysilicon), and material of the gate insulator layer 312 may include an oxide of silicon.

In some forms, the step S201 may include: providing the active region; and etching the active region to form a groove therein. Optionally, the step S201 may further include: forming the gate insulator layer in the groove, for example, using the deposition process. Optionally, the step S201 may further include: forming a gate material layer (for example, the gate material layer may be a polysilicon) on the gate insulator layer, for example, using the deposition process. A portion of the gate material layer is filled in the groove, and the other portion is formed on the active region. Optionally, the step S201 may further include: removing the redundant gate material layer on the active region using the etching or planarization process, and using the gate material layer remained in the groove as the gate electrode.

Back to FIG. 2, in step S202, a surface insulator layer is formed on the upper surface of the gate electrode. For example, the material of the surface insulator layer may include an oxide of silicon. In the step S202, the surface insulator layer and the gate insulator layer enclose the gate electrode.

In some forms, the surface insulator layer may be formed through performing oxidation on the upper surface of the gate electrode. For example, the upper surface of the gate electrode is oxidized through performing annealing processing on the upper surface of the gate electrode in an atmosphere of air or oxygen, so as to form the surface insulator layer. Optionally, the annealing processing may be a laser annealing processing. Through the laser annealing processing, the upper surface of the gate electrode may be conveniently oxidized, and thickness of a formed silicon oxide layer may be controlled, thereby facilitating to improve the performance of the device.

A person of ordinary skill in the art will appreciate that methods for forming the surface insulator layer herein is not limited to the foregoing method, and other methods may also be used. For example, the surface insulator layer may be formed through depositing, or the oxidation process may be performed through other annealing processes.

Figure 4:
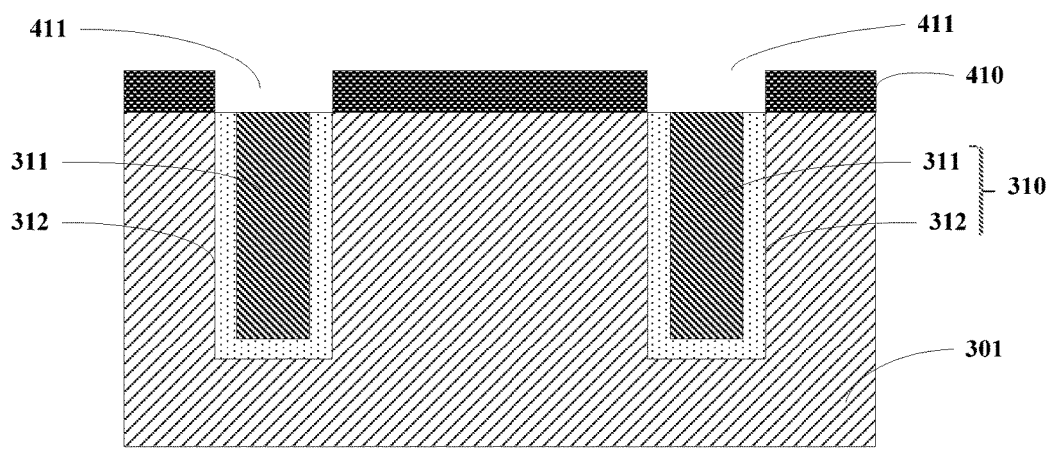
FIG. 4 is a sectional diagram that schematically illustrates a structure at a phase of a manufacturing process of a semiconductor device according to some forms of the present disclosure.
Figure 5:
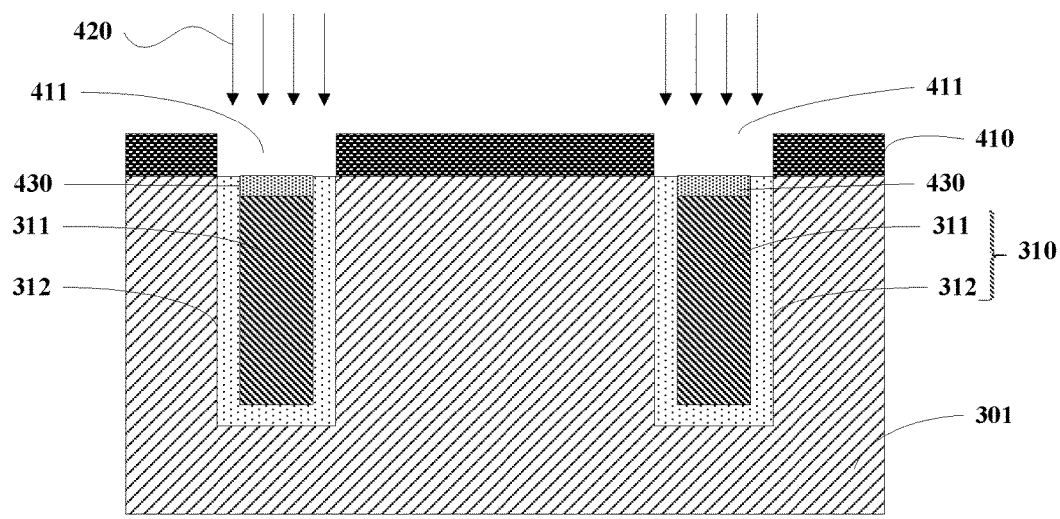
FIG. 5 is a sectional diagram that schematically illustrates a structure at a phase of a manufacturing process of a semiconductor device according to some forms of the present disclosure.
Figure 6:
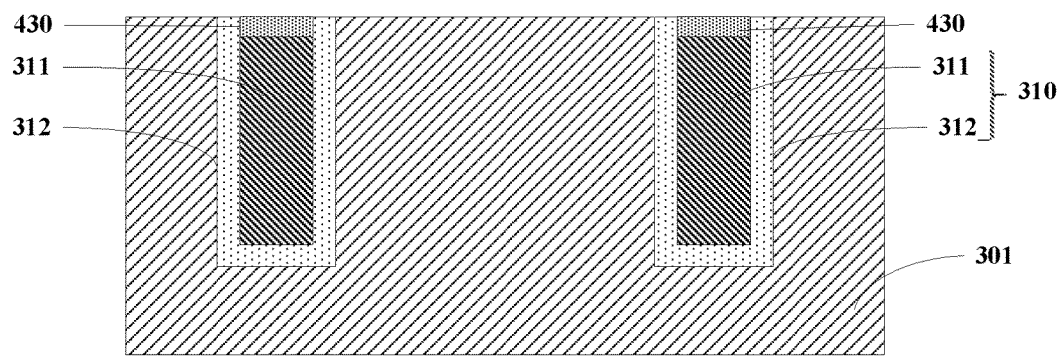
FIG. 6 is a sectional diagram that schematically illustrates a structure at a phase of a manufacturing process of a semiconductor device according to some forms of the present disclosure.

FIG. 4 to FIG. 6 are sectional diagrams that schematically illustrate structures at multiple phases of a step of performing a laser annealing processing according to some forms of the present disclosure. The process of performing the laser annealing processing is described in detail below with reference to FIG. 4 to FIG. 6.

For example, as shown in FIG. 4, the step of performing the laser annealing processing may include: forming a patterned first mask layer 410 on a semiconductor structure. The first mask layer 410 has a first opening 411 exposing the upper surface of the gate electrode 311. For example, the patterned first mask layer may be formed using the deposition and photoetching processes. The material of the first mask layer may include a photoresist.

Subsequently, as shown in FIG. 5, the step of performing the laser annealing processing may further include: in an atmosphere of air or oxygen, irradiating a laser pulse 420 to the upper surface of the gate electrode 311 through the first opening 411, so as to perform the laser annealing processing (for example, local laser annealing), thereby oxidizing the upper surface of the gate electrode 311, so as to form a surface insulator layer 430. For example, the laser pulse is ultraviolet (UV) laser pulse.

In this step, under laser irradiation, melting occurs on a surface of the gate electrode. In the course of the melting, the surface of the gate electrode absorbs oxygen. Therefore, in the course of melting and resolidification of the surface, because the absorbed oxygen is captured in a regeneration area of the gate electrode, a quick oxidation occurs in this area, and an oxide layer (for example, a silicon oxide layer) is formed to serve as the surface insulator layer. A high-quality oxide layer (for example, the compactness is higher) may be obtained through the laser annealing processing, and thickness of the oxide layer may be controlled. Since the laser annealing process may be performed using an existing device, the cost is basically not increased.

Figure 14:
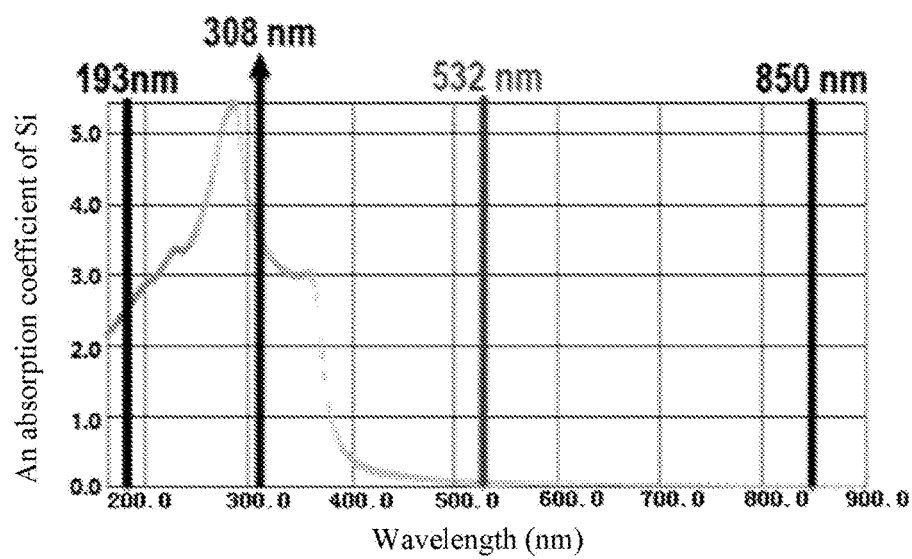
FIG. 14 is an absorbance spectrum diagram which schematically illustrates Si according to some forms of the present disclosure.

Optionally, a wavelength range of the laser pulse may be from 200 nm to 350 nm (for example, the wavelength may be 250 nm or 300 nm). For example, reference may be made to the absorbance spectrum diagram of Si which is researched by the inventor of the present disclosure, i.e., FIG. 14. It can be seen from FIG. 14 that Si is easy to absorb light within a wavelength range from 200 nm to 350 nm. That is, the surface of Si is easier to be melted using the light within this wavelength range so that the silicon oxide layer is formed by absorbing oxygen. Therefore, using the laser pulse of this wavelength range facilitates to control the thickness of the generated silicon oxide layer (serving as a surface insulator layer).

In some forms, the thickness of the surface insulator layer may be controlled and adjusted by adjusting energy and/or irradiation times of the laser pulse. Through adjusting the thickness of the surface insulator layer, leakage current between the conductive contact layer (which is described later) and the gate electrode may be optimized, so as to improve the performance of the device.

In some forms, the thickness of the surface insulator layer 430 may be smaller than 1000 Å. For example, the thickness of the surface insulator layer may be 400 Å or 800 Å.

Subsequently, as shown in FIG. 6, the step of performing the laser annealing processing may further include: removing the first mask layer 410. Through the foregoing step of performing the laser annealing processing, the surface insulator layer 430 is formed on the upper surface of the gate electrode 311.

Back to FIG. 2, in step S203, form a patterned interlayer dielectric layer on the semiconductor structure, where the interlayer dielectric layer covers the surface insulator layer, and has a first through hole exposing a portion of the active region.

In some forms, the first through hole may be a tapered through hole (for example, a conical through hole). The tapered through hole has an upper opening far away from the upper surface of the active region and a lower opening adjacent to the upper surface of the active region, where a width of the upper opening is greater than a width of the lower opening. In the subsequent procedure of forming the conductive contact layer, the tapered through hole enables to reduce the slot or hole in the conductive contact layer which is caused by the step coverage, so as to facilitates the bonding of the metal connector (or the metal wire).

Certainly, a person of ordinary skill in the art may appreciate that the present disclosure may also use through holes with other shapes, for example, the through holes having a plurality of steps and approximate to the tapered shape, and the existing through hole. Therefore, the scope of the present disclosure is not only limited thereto.

Optionally, an angle range of a side-wall inclination angle of the foregoing tapered through hole may be from 30° to 40°. For example, the side-wall inclination angle may be 35° or 38.9°. It should be noted that the side-wall inclination angle refers to an acute angle intersected by a side wall of the tapered through hole and the upper surface of the active region. The angle range facilitates to reduce the slot or hole that possibly occur in the conductive contact layer subsequently, and also a current leakage that is caused by a too thin incline portion of the interlayer dielectric layer due to the small angle would not easily occur.

Certainly, a person of ordinary skill in the art may appreciate that the range of the foregoing inclination angle may also be another range, for example, being less than 30°. Therefore, the scope of the present disclosure is not only limited to the angle range disclosed above.

FIG. 7 to FIG. 10 are sectional diagrams that schematically illustrate structures at multiple phases of a step of forming a patterned interlayer dielectric layer on a semiconductor structure according to some forms of the present disclosure. The procedures of forming the patterned interlayer dielectric layer are described below in detail with reference to FIG. 7 to FIG. 10.

Figure 7:
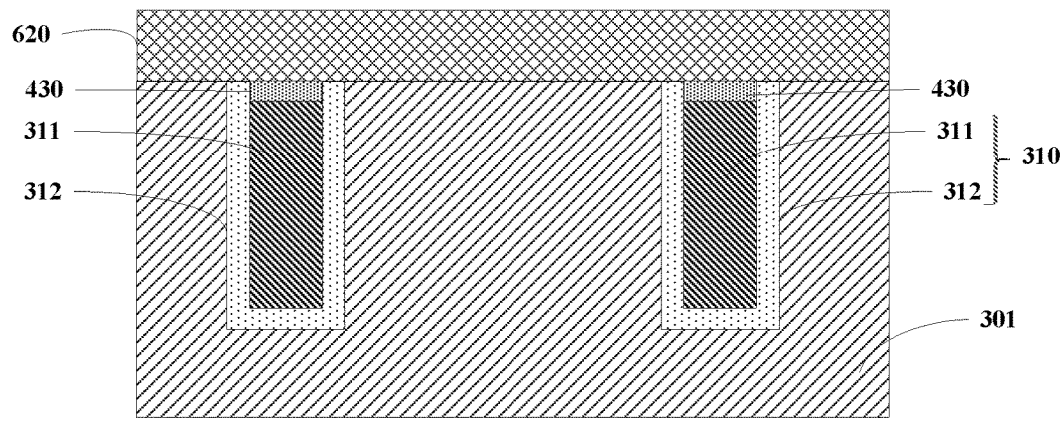
FIG. 7 is a sectional diagram that schematically illustrates a structure at a phase of a manufacturing process of a semiconductor device according to some forms of the present disclosure.

For example, as shown in FIG. 7, the step of the forming a patterned interlayer dielectric layer on the semiconductor structure may include: forming an interlayer dielectric layer 620 covering the semiconductor structure, for example, using the deposition process. For example, the material of the interlayer dielectric layer may include a silicon dioxide. The thickness of the interlayer dielectric layer may be a few tenths of microns to several microns, for example, 1 μm.

Figure 8:
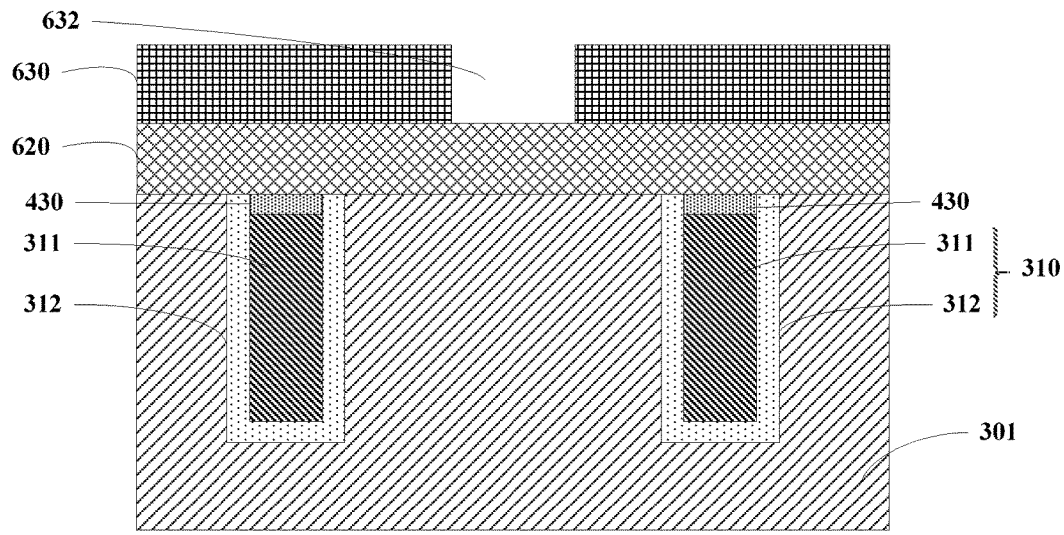
FIG. 8 is a sectional diagram that schematically illustrates a structure at a phase of a manufacturing process of a semiconductor device according to some forms of the present disclosure.

Subsequently, as shown in FIG. 8, the step of the forming a patterned interlayer dielectric layer on the semiconductor structure may further include: forming a patterned second mask layer 630 on the interlayer dielectric layer 620. The second mask layer 630 has a second opening 632 exposing a portion of the interlayer dielectric layer 620. For example, the second mask layer may be formed using the coating and the photoetching processes. Optionally, the material of the second mask layer is a photoresist. Using the photoresist facilitates to perform the subsequent reflow processing.

Figure 9:
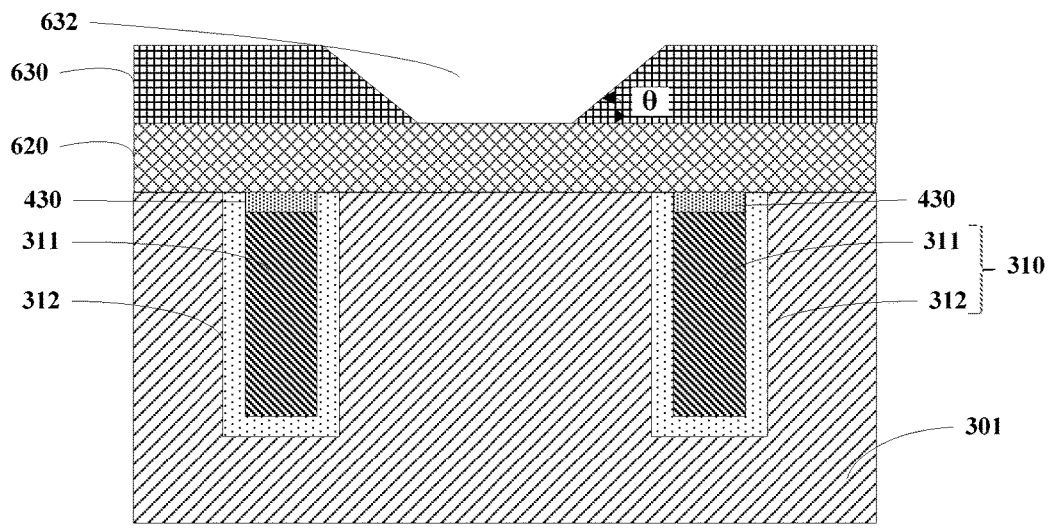
FIG. 9 is a sectional diagram that schematically illustrates a structure at a phase of a manufacturing process of a semiconductor device according to some forms of the present disclosure.

Subsequently, as shown in FIG. 9, the step of the forming a patterned interlayer dielectric layer on the semiconductor structure may further include: performing reflow processing on the second mask layer 630, so as to decrease a side-wall inclination angle θ of the second opening, thereby forming the second opening as a tapered opening with a smaller side-wall inclination angle. It should be noted that the inclination angle θ herein refers to an acute angle intersected by a side wall of the second opening and an upper surface of the interlayer dielectric layer, as shown in FIG. 9. Optionally, an angle range of the inclination angle θ is from 30° to 40°.

In some forms, a temperature range of the reflow processing may be from 100° C. to 300° C. For example, the temperature of the reflow processing may be 150° C., 200° C., or 240° C. Certainly, the temperature of the reflow processing may also be within another temperature range. The scope of the present disclosure is not only limited hereto.

In some forms, a time range of the reflow processing may be from 2 minutes to 5 minutes. For example, the time for the reflow processing may be 3 minutes or 4 minutes. Certainly, the time for the reflow processing may also be within another time range. Therefore, the scope of the present disclosure is not only limited hereto.

Figure 10:
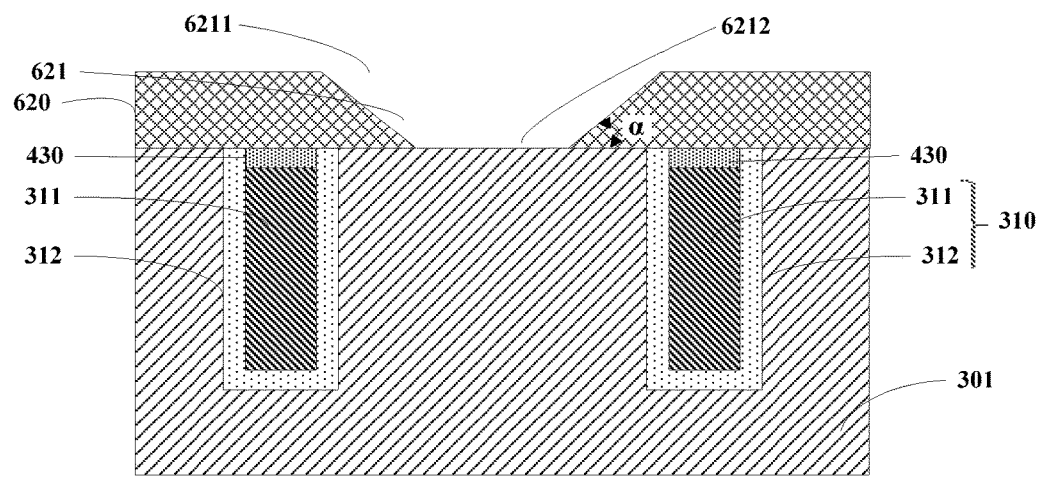
FIG. 10 is a sectional diagram that schematically illustrates a structure at a phase of a manufacturing process of a semiconductor device according to some forms of the present disclosure.

Subsequently, as shown in FIG. 10, the step of the forming a patterned interlayer dielectric layer on the semiconductor structure may further include: etching the interlayer dielectric layer 620 using the second mask layer 630 processed by the reflow processing as a mask, so as to form the first through hole (the first through hole may also be referred to as a contact through hole) 621. In the course of the etching, the second mask layer is also continuously etched, a thinner portion in the second mask layer is quickly etched, and the thicker portion is slowly etched. Therefore, the etching process may copy the appearance of the second mask layer onto the interlayer dielectric layer below, so as to form the first tapered through hole in the interlayer dielectric layer.

In this step, as shown in FIG. 10, a first through hole 621 exposing a portion of the active region is formed in the interlayer dielectric layer. The first through hole 621 may be a tapered through hole (for example, being conical). The tapered through hole has an upper opening 6211 far away from the upper surface of the active region 301 and a lower opening 6212 adjacent to the upper surface of the active region 301, where a width of the upper opening 6211 is greater than a width of the lower opening 6212. If the tapered through hole is a conical through hole, a diameter of the upper opening is greater than a diameter of the lower opening.

Optionally, an angle range of a side-wall inclination angle α of the tapered through hole (α is the acute angle intersected by the side wall of the tapered through hole and the upper surface of the active region) may be from 30° to 40°. For example, the side-wall inclination angle α may be 35° or 38.9°.

Subsequently, as shown in FIG. 10, the step of the forming a patterned interlayer dielectric layer on the semiconductor structure may further include: removing the second mask layer 630. For example, the remained second mask layer that is not completely etched in the foregoing etching step may be removed.

So far, the patterned interlayer dielectric layer 620 is formed on the semiconductor structure. The interlayer dielectric layer 620 covers the surface insulator layer 430, and has the first through hole 621 exposing a portion of the active region 301.

Back to FIG. 2, in step S204, a conductive contact layer passing through the first through hole and contacting with the active region is formed.

Figure 11:
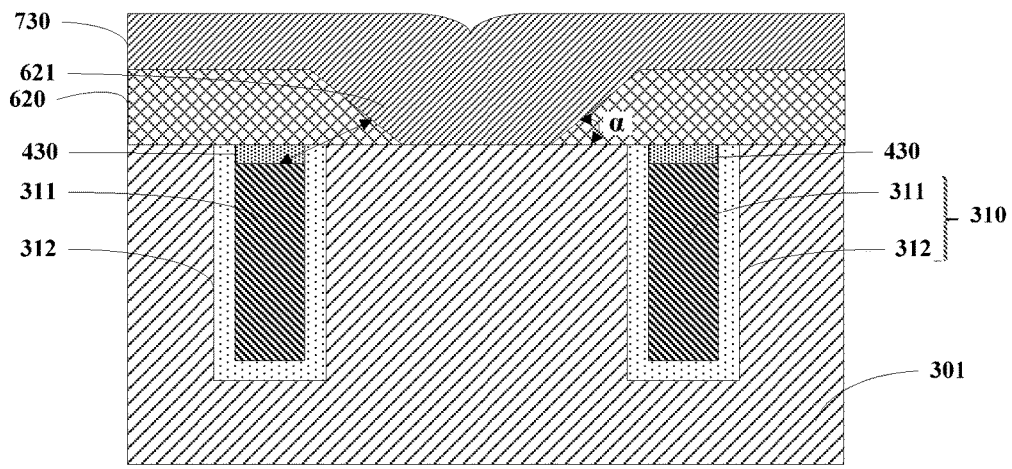
FIG. 11 is a sectional diagram that schematically illustrates a structure at a phase of a manufacturing process of a semiconductor device according to some forms of the present disclosure.

FIG. 11 is a sectional diagram that schematically illustrates a structure at step S204 according to some forms of the present disclosure. As shown in FIG. 11, a conductive contact layer 730 passing through the first through hole 621 and contacting with the active region 301 is formed using, for example, the deposition process. The conductive contact layer 730 covers the interlayer dielectric layer 620. For example, the material of the conductive contact layer 730 may include metals such as aluminum. A thickness of the conductive contact layer 730 may be several microns, for example, 4 μm.

So far, a method for manufacturing a semiconductor device according to some forms of the present disclosure is provided. According to the manufacturing method, a surface insulator layer may be formed on an upper surface of a gate electrode, so as to increase a distance from the gate structure to the conductive contact layer, for example, as shown by the straight line with a double-headed arrow in FIG. 11. In this way, leakage current that is possibly generated between the conductive contact layer and the gate structure may be reduced, so that performance of a device is improved.

Further, in the foregoing manufacturing method, a through hole of an interlayer dielectric layer (i.e., the first through hole) may further present a taper shape with a smaller side-wall inclination angle in comparison with the prior art. Therefore, a step coverage of the conductive contact layer may be improved, a slot or hole that may be formed in the conductive contact layer is reduced (as shown in FIG. 11) and even removed, thereby facilitating subsequent bonding of a metal connector (or a metal wire), and improving reliability of the device. In addition, the cost is relatively low because the foregoing method may use existing equipment without needing to purchases new devices.

Figure 12:
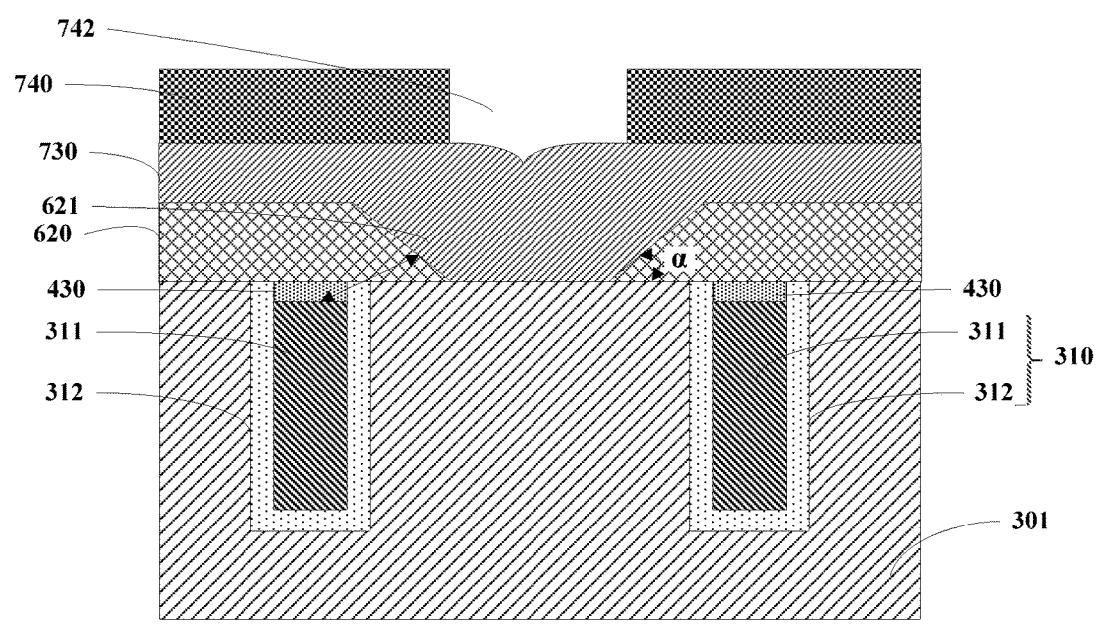
FIG. 12 is a sectional diagram that schematically illustrates a structure at a phase of a manufacturing process of a semiconductor device according to some forms of the present disclosure.

In some forms of the present disclosure, the foregoing method for manufacturing a semiconductor device may further include: as shown in FIG. 12, forming a patterned passivation layer 740 on the conductive contact layer 730. The passivation layer 740 has a second through hole 742 exposing a portion of the conductive contact layer 730. For example, the passivation layer 740 is formed on the conductive contact layer 730 using the deposition process; and then etching is performed on the passivation layer 740, so as to form the second through hole 742 exposing a portion of the conductive contact layer 730.

Figure 13:
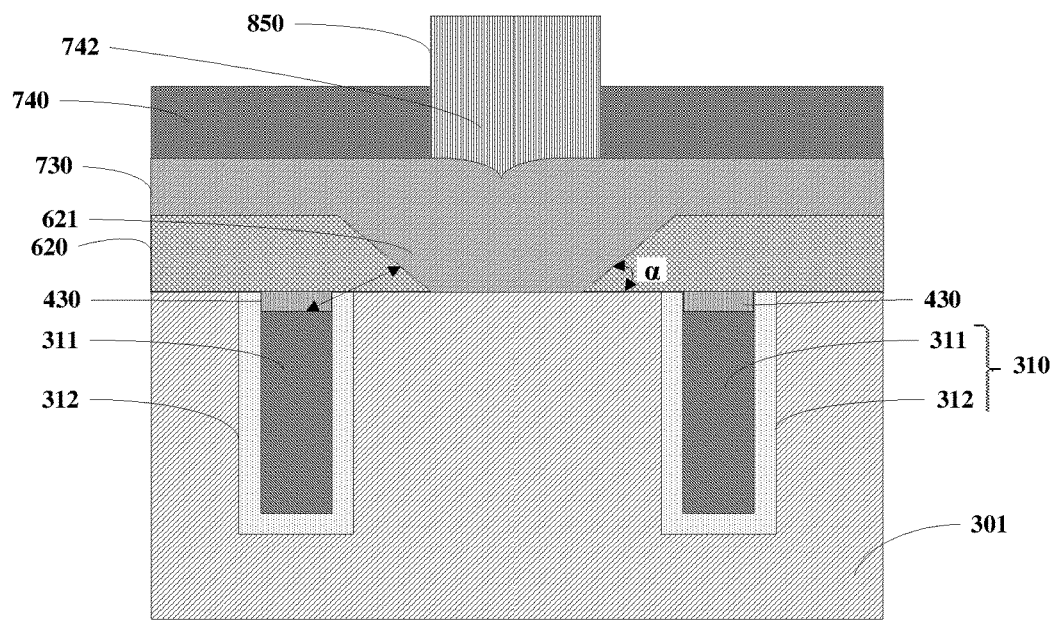
FIG. 13 is a sectional diagram that schematically illustrates a structure at a phase of a manufacturing process of a semiconductor device according to some forms of the present disclosure.

In some forms of the present disclosure, the foregoing method for manufacturing a semiconductor device may further include: as shown in FIG. 13, a metal connector 850 passing through the second through hole 742 and contacting with the conductive contact layer 730 is formed (for example, using the deposition or bonding technologies). The metal connector may be a metal wire.

Through the foregoing manufacturing method, a metal connector connected to an active region via a conductive contact layer is formed. In the foregoing steps, the slot or hole possibly formed in the conductive contact layer is reduced. Therefore, the formed metal connector can be connected to the conductive contact layer more firmly, thereby reducing the possibility of false welding or unsoldering, so as to improve the reliability of the device.

The present disclosure further provides a semiconductor device. As shown in FIG. 13, the semiconductor device may include: an active region 301 and a gate structure 310 located in the active region 301. The gate structure 310 at least includes a gate electrode 311. The active region 301 exposes an upper surface of the gate electrode 311. For example, material of the gate electrode 311 may include a polysilicon. The gate structure 310 may further include a gate insulator layer 312 separating the gate electrode 311 from the active region 301. Material of the gate insulator layer 312 may include an oxide of silicon.

As shown in FIG. 13, the semiconductor device may further include: a surface insulator layer 430 on the upper surface of the gate electrode 311. For example, the material of the surface insulator layer 430 may include an oxide of silicon. The surface insulator layer 430 and the gate insulator layer 312 enclose the gate electrode 311.

As shown in FIG. 13, the semiconductor device may further include: a patterned interlayer dielectric layer 620 on the active region 301. The interlayer dielectric layer 620 covers the surface insulator layer 430, and has a first through hole 621 exposing a portion of the active region 301.

In some forms, the first through hole 621 may be a tapered through hole. The tapered through hole has an upper opening (for example, the upper opening 6211 described above) far away from the upper surface of the active region 301 and a lower opening (for example, the lower opening 6212 described above) adjacent to the upper surface of the active region 301. The width of the upper opening is greater than the width of the lower opening.

In some forms, an angle range of a side-wall inclination angle $\alpha$ of the tapered through hole is from 30° to 40°. For example, the side-wall inclination angle $\alpha$ may be 35° or 38.9°.

As shown in FIG. 13, the semiconductor device may further include: a conductive contact layer 730 passing through the first through hole 621 and contacting with the active region 301. For example, the material of the conductive contact layer 730 may include metals such as aluminum. A thickness of the conductive contact layer 730 may be several microns, for example, 4 µm.

In some forms, as shown in FIG. 13, the semiconductor device may further include: a patterned passivation layer 740 on the conductive contact layer 730. The passivation layer 740 has a second through hole 742 exposing a portion of the conductive contact layer 730.

In some forms, as shown in FIG. 13, the semiconductor device may further include: a metal connector 850 passing through the second through hole 742 and contacting with the conductive contact layer 730.

In the semiconductor device of the forms of the present disclosure, the surface insulator layer is formed on the upper surface of the gate electrode, which increases a distance from the gate electrode to the conductive contact layer, for example, as shown by the straight line of a double-headed arrow in FIG. 13. In this way, leakage current that is possibly generated between the conductive contact layer and the gate electrode may be reduced, so that performance of a device is improved.

Further, in the foregoing semiconductor device, a through hole of the interlayer dielectric layer (i.e., the first through hole) presents a taper shape with a smaller side-wall inclination angle in comparison with the prior art. Therefore, the step coverage of the conductive contact layer may be improved, and a slot or a hole that may be formed in the conductive contact layer is reduced, thereby facilitating bonding of a metal connector, and improving the reliability of the device.

So far, the method for manufacturing a semiconductor device and the formed semiconductor device according to the present disclosure have been described in detail. To avoid obscuring the idea of the present disclosure, some details generally known in the art are not described. According to the foregoing description, a person of ordinary skill in the art may completely appreciate how to implement the technical solutions disclosed herein.

Some specific forms of the present disclosure are described in detail by means of examples. However, a person of ordinary skill in the art should appreciate that the foregoing examples are merely for purpose of description, but are not intended to limit the scope of the present disclosure. A person of ordinary skill in the art should understand that the foregoing forms may be modified without departing from the scope and spirit of the present disclosure. The scope of the present disclosure is defined by the appended claims.

What is claimed is:

1. A semiconductor device, comprising:
   an active region;
   a gate structure located in the active region, the gate structure at least comprising a gate electrode, and the active region exposing an upper surface of the gate electrode;
   a surface insulator layer positioned on the upper surface of the gate electrode;
   a patterned interlayer dielectric layer on the active region, wherein the interlayer dielectric layer covers the surface insulator layer, and has a first through hole exposing a portion of the active region; and
   a conductive contact layer passing through the first through hole and contacting with the active region;
   wherein an angle range of a side-wall inclination angle of the tapered through hole is from 30° to 40°.

2. The semiconductor device according to claim 1, wherein:
   material of the gate electrode comprises polysilicon; and
   material of the surface insulator layer comprises an oxide of silicon.

3. The semiconductor device according to claim 1, wherein:
   the first through hole is a tapered through hole, the tapered through hole having an upper opening far away from an upper surface of the active region and a lower opening adjacent to the upper surface of the active region, wherein a width of the upper opening is greater than a width of the lower opening.

4. The semiconductor device according to claim 1, wherein
   the gate structure further comprises a gate insulator layer separating the gate electrode from the active region,
   wherein, the surface insulator layer and the gate insulator layer enclose the gate electrode.

5. A semiconductor device, comprising:
   an active region;
   a gate structure located in the active region, the gate structure at least comprising a gate electrode, and the active region exposing an upper surface of the gate electrode;
   a surface insulator layer positioned on the upper surface of the gate electrode;
   a patterned interlayer dielectric layer on the active region, wherein the interlayer dielectric layer covers the surface insulator layer, and has a first through hole exposing a portion of the active region;
   a conductive contact layer passing through the first through hole and contacting with the active region;
   a patterned passivation layer on the conductive contact layer, the patterned passivation layer having a second through hole exposing a portion of the conductive contact layer; and
   a metal connector passing through the second through hole and contacting with the conductive contact layer.

6. The semiconductor device according to claim 5, wherein:
   material of the gate electrode comprises polysilicon; and
   material of the surface insulator layer comprises an oxide of silicon.

7. The semiconductor device according to claim 5, wherein:
   the first through hole is a tapered through hole, the tapered through hole having an upper opening far away from an upper surface of the active region and a lower opening adjacent to the upper surface of the active region, wherein a width of the upper opening is greater than a width of the lower opening.

8. The semiconductor device according to claim 5, wherein an angle range of a side-wall inclination angle of the tapered through hole is from 30° to 40°.

9. The semiconductor device according to claim 5, wherein the gate structure further comprises a gate insulator layer separating the gate electrode from the active region, wherein, the surface insulator layer and the gate insulator layer enclose the gate electrode.

\* \* \* \* \*